United States Patent
Sashinaka et al.

(10) Patent No.: US 7,232,263 B2
(45) Date of Patent: Jun. 19, 2007

(54) OPTICAL COMMUNICATIONS MODULE AND SUBSTRATE FOR THE SAME

(75) Inventors: Nobuo Sashinaka, Neyagawa (JP); Kazunari Nishihara, Sakai (JP); Tetsuya Tsurunari, Kadoma (JP); Naoki Yuda, Hirakata (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 316 days.

(21) Appl. No.: 10/500,529

(22) PCT Filed: Nov. 12, 2003

(86) PCT No.: PCT/JP03/14351

§ 371 (c)(1),
(2), (4) Date: Jul. 1, 2004

(87) PCT Pub. No.: WO2004/045111

PCT Pub. Date: May 27, 2004

(65) Prior Publication Data

US 2005/0226569 A1    Oct. 13, 2005

(30) Foreign Application Priority Data

Nov. 13, 2002   (JP)  ............................. 2002-329448

(51) Int. Cl.
*G02B 6/36* (2006.01)
*G02B 6/42* (2006.01)

(52) U.S. Cl. .............................. 385/88; 385/52; 385/92

(58) Field of Classification Search ...................... None
See application file for complete search history.

(56) References Cited

U.S. PATENT DOCUMENTS 4,826,272 A * 5/1989 Pimpinella et al. ........... 385/92

(Continued)

FOREIGN PATENT DOCUMENTS

EP        1 202 405        5/2002

(Continued)

OTHER PUBLICATIONS

M. Karppinen et al., "Passively Aligned Fiber-Optic Transmitter Integrated into LTCC Module", 2001 IEEE Proceedings 51st, Electronic Components and Technology Conference, vol. CONF. 51, pp. 20-21, May 2001.

(Continued)

*Primary Examiner*—Rodney Bovernick
*Assistant Examiner*—Mike Stahl
(74) *Attorney, Agent, or Firm*—RatnerPrestia

(57) ABSTRACT

A substrate on which cavities having floors and steps is provided. End faces of a light-emitting device, an optical component, and an optical transmission line are abutted on one of the cavity for positioning, and end faces of a light-receiving device, an optical component, and an optical transmission line are also abutted on the other cavity for positioning. Integrated alignment of optical axes facilitates alignment of optical axes, and thus eliminates the need of a CAN package. Accordingly, the size and height of an optical communications module can be reduced.

30 Claims, 17 Drawing Sheets

U.S. PATENT DOCUMENTS

| | | | |
|---|---|---|---|
| 5,113,404 A * | 5/1992 | Gaebe et al. | 372/36 |
| 5,257,336 A * | 10/1993 | Dautartas | 385/93 |
| 5,896,481 A * | 4/1999 | Beranek et al. | 385/90 |
| 6,103,398 A | 8/2000 | Norton et al. | |
| 6,205,274 B1 | 3/2001 | Zhou | |
| 6,445,475 B1 | 9/2002 | Okubora et al. | |
| 6,632,030 B2 * | 10/2003 | Jiang et al. | 385/93 |
| 6,739,764 B2 * | 5/2004 | Ido et al. | 385/92 |
| 6,757,308 B1 * | 6/2004 | Eldring et al. | 372/36 |
| 7,004,644 B1 * | 2/2006 | Johnson | 385/89 |
| 2002/0037141 A1 | 3/2002 | Miyamoto et al. | |
| 2003/0053767 A1 * | 3/2003 | Cheng et al. | 385/89 |

FOREIGN PATENT DOCUMENTS

| | | |
|---|---|---|
| WO | WO 99/44087 | 9/1999 |
| WO | WO 2003/019617 | 3/2003 |

OTHER PUBLICATIONS

J. Hiltunen et al., Passive Multimode Fiber-to-Edge-Emitting Laser Alignment Based on a Multilayer LTCC Substrate, 52$^{nd}$ Electronic Components and Technology Conference 2002, pp. 815-820, May 2002.

International Search Report corresponding to application No. PCT/JP03/14351 dated Apr. 23, 2004.

* cited by examiner

OPTICAL COMMUNICATIONS MODULE
AND SUBSTRATE FOR THE SAME

This application is a U.S. National Phase Application of PCT International Application PCT/JP2003/014351.

TECHNICAL FIELD

The present invention relates to small and short optical modules for communications, and substrates used in the modules that allow easy adjustment of optical axes.

BACKGROUND ART

FIG. 17 shows an entire image of a package including a conventional transceiver module for optical communications. The entire package is configured with optical transmission line 41, CAN Package for transmission (hereafter "package") 24, and CAN Package for reception (hereafter "package") 25. Fixing jig 42 secures optical transmission line 41. Packages 24 and 25 are mounted on printed circuit board (hereafter "board") 34, and enclosed in package 21. The name CAN Package comes from the use of a metal can for the package. Fixing jig 42 and adapter 21A of package 21 are fitted, and the optical axis of optical transmission line 41 and optical axes of packages 24 and 25 are aligned by means of this modular structure.

FIG. 18 shows board 34 enclosed in package 21. Packages 24 and 25, semiconductor device 45, and passive element 26 are mounted on board 34.

FIG. 19 is a sectional view of FIG. 18 taken along Line A–A' on board 34 including the center axes of packages 24 and 25. Light-emitting device 29 is mounted inside package 24, and sealing material 33 hermetically seals this package 24. In addition, optical component 27 such as lens or window is installed in package 24. The light emitted from light-emitting device 29 enclosed in package 24 passes through optical component 27 and enters optical transmission line 41 whose optical axis is aligned by the modular structure. This enables the module to transmit signals.

In the same way, light-receiving device 30 is mounted inside package 25, and sealing material 33 hermetically seals this package 25. In addition, optical component 28 such as lens or window is installed in package 25. The light output from transmission line 41 of the reception side whose optical axis is aligned by the modular structure passes through optical component 28 installed in package 25, and arrives at light-receiving device 30. This enables the module to receive signals. This type of package, including a transceiver module for optical communications, is disclosed in Japanese Unexamined Patent Publication No. H11-345987.

In the above structure, however, the alignment of optical axes of light-emitting device 29 and light-receiving device 30, and respective optical components 27 and 28 depends on packages 24 and 25. Moreover, the alignment of the optical axes of light-emitting device 29, light-receiving device 30, and optical components 27 and 28 and the optical axis of optical transmission line 41 depends on the modular structure of fixing jig 42 and adapter 21A of package 21. For each alignment, the optical axes need to be separately aligned. Furthermore, the size of packages 24 and 25 limits downsizing and height reduction because packages 24 and 25 are mounted on board 34.

DISCLOSURE OF INVENTION

An optical communications module of the present invention employs a substrate that has a cavity with a floor and a step. A light-emitting device, an optical component, and an end face of an optical transmission line are positioned by abutting them on and fitting them into the cavity. A light-receiving device, an optical component and an end face of optical transmission line are positioned by abutting them on and fitting them into the cavity.

DETAILED DESCRIPTION OF PREFERRED EMBODIMENTS

Figure 1:
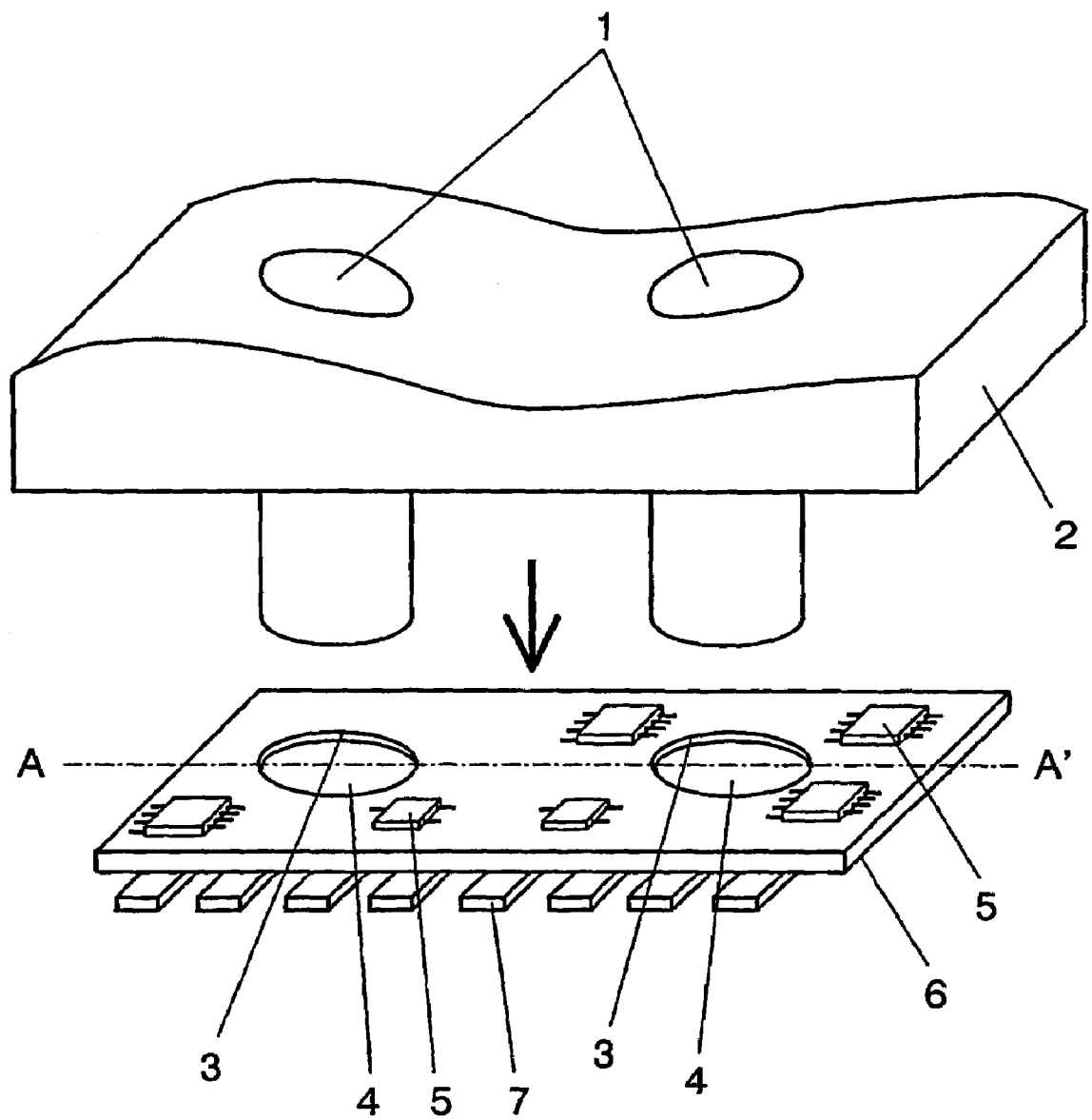
FIGS. 1 and 2 are perspective views of a transceiver module for optical communications in accordance with a first exemplary embodiment of the present invention.

Exemplary embodiments of the present invention are described below with reference to drawings. For reasons of simplicity, the same reference numerals are given to the same structures.

First Exemplary Embodiment

Figure 2:
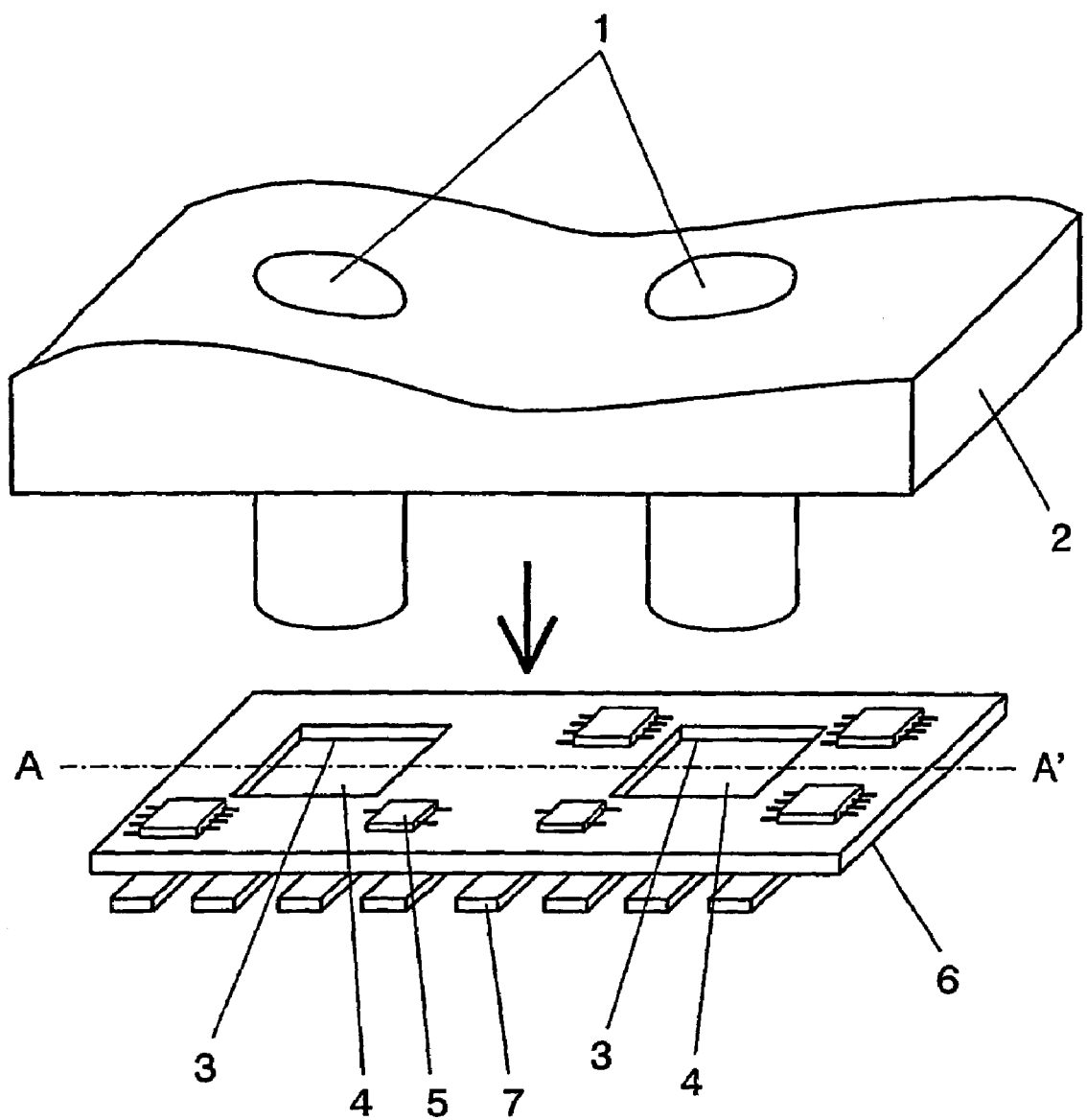
Figure 3:
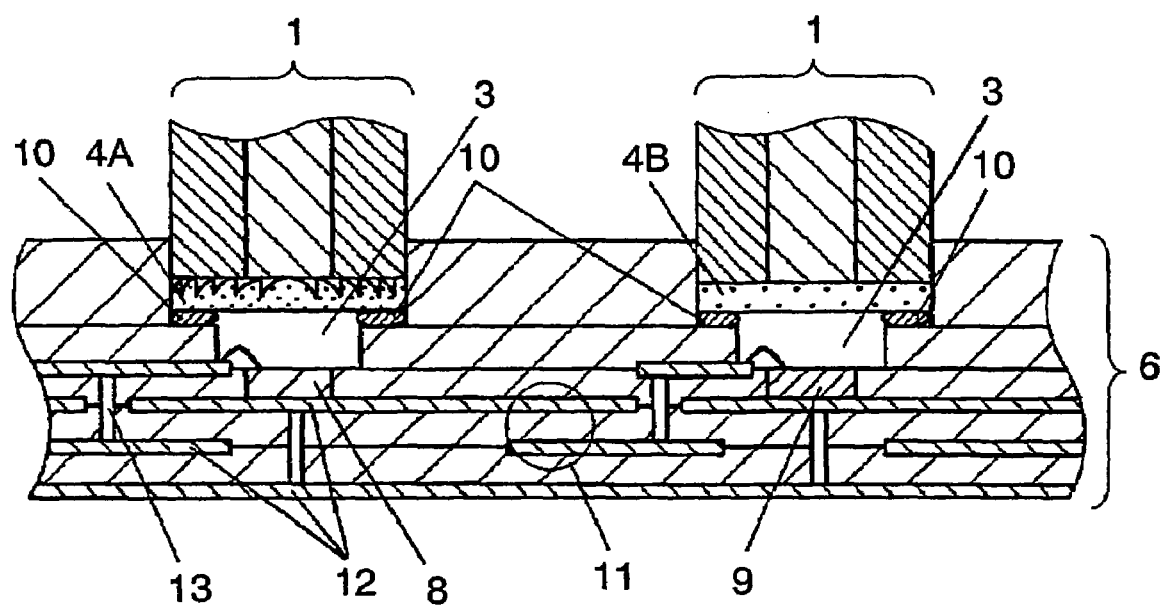
FIG. 3 is a sectional view of the transceiver module for optical communications in accordance with the first exemplary embodiment of the present invention.

FIGS. 1 and 2 are perspective views of a transceiver module for optical communications in a first exemplary embodiment of the present invention. FIG. 3 is a sectional view taken along Line A–A' in FIG. 1 or FIG. 2.

In FIG. 1, substrate (hereafter "substrate") 6 is a multilayer ceramic substrate on which semiconductor devices 5 are mounted, and substrate 6 has cavities 3 with at least one step and a floor. Semiconductor devices 5 are components of a photoelectric converting circuit, and are ICs that convert electrical signals to light and vice versa. This photoelectric converting circuit exchanges signals with an external circuit via terminal 7. Fixing jig 2 for optical transmission line secures two cores of optical transmission lines 1. Optical transmission lines 1 are abutted on cavities 3 on substrate 6. The transceiver module for optical communications of the exemplary embodiment is configured as described above. The top steps of cavities 3 have substantially the same shape as optical transmission line 1, and optical components 4 such as a refractive lens, diffractive lens, optical iris, and window which have substantially the same outline as optical transmission line 1 are also disposed on this top steps. Cavity 3 can also have two or more steps, and optical transmission line 1 and optical components 4 can be disposed on the same step.

At the optical system on the transmission side, the refractive lens or the diffractive lens focuses the light output from light-emitting device 8, and apply this light to optical transmission line 1 of the transmission side at high efficiency. At the optical system on the reception side, the refractive lens or the diffractive lens focuses the light output from optical transmission line 1 of the reception side, and applies the light to light-receiving device 9 at high efficiency. Moreover, the diffractive lens shortens the focal distance so as to shorten the distance between light-emitting device 8 or light-receiving device 9 and optical transmission line 1. In the optical system at the transmission side, the optical iris removes excess light in the light output from light-emitting device 8 and then applies the light to optical transmission line 1 of the transmission side. In the optical system on the reception side, the optical iris removes excess light in the light output from optical transmission line 1 of the reception side, and applies the light to light-receiving device 9.

To position optical transmission line 1 and optical components 4 by the top step of cavity 3, the outlines of optical transmission line 1, the top step of cavity 3, and optical components 4 are made substantially the same, as shown in FIG. 1. However, if optical transmission line 1 is uniquely positioned, cavity 3 and optical components 4 can have other shapes, as shown in FIG. 2, such as a square and triangle.

In FIG. 3, electric line 12, via hole 13, and passive elements 11 including a coil, a capacitor, and a resistor, which are components of the photoelectric converting circuit, are disposed on inner layers of substrate 6 which is a multilayer ceramic substrate.

Cavities 3 created on the surface of substrate 6 have at least one step, and light-emitting device 8 and light-receiving device 9 are mounted on their floors. In addition, optical components 4 are disposed on the top steps of cavities 3, and hermetically sealed by sealing material 10 made such as of glass, resin, and solder. Optical transmission lines 1 are abutted immediately on optical components 4 such that optical transmission lines 1 contact optical components 4. Sealing of optical components 4 in the multi-step cavities allows reduction of the number of components, thus simplifying the structure. In addition, the performance of hermetically sealed light-emitting device 8 or light-receiving device 9 is stabilized, suppressing secular changes in light-emitting device 8 or light-receiving device 9. The use of resin for sealing facilitates sealing. The use of solder for sealing eliminates the need to apply kovar glass to optical components 4.

In the example shown in FIG. 3, a light-emitting diode (LED) chip and photo diode (PD) chip are mounted respectively as light-emitting device 8 and light-receiving device 9. Diffractive lens 4A and window 4B made of glass are disposed as optical components 4. Optical transmission lines 1, each made of a plastic-clad fiber, are then abutted on cavities 3. Each cavity 3 has two steps for allowing electrical connection of the surface of the LED chip or PD chip to an upper step by wire bonding. Laser diode (LD) can also be used as light-emitting device 8. Photoelectric conversion is simplified by use of these optical semiconductor devices as light-emitting device 8 and light-receiving device 9.

Figure 16A:
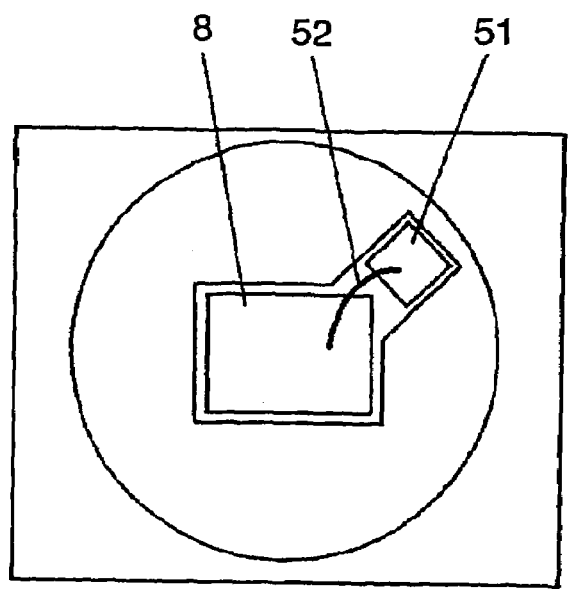
FIG. 16A is a top view of a wire bonding in a multi-step cavity in accordance with the exemplary embodiments of the present invention.
Figure 16B:
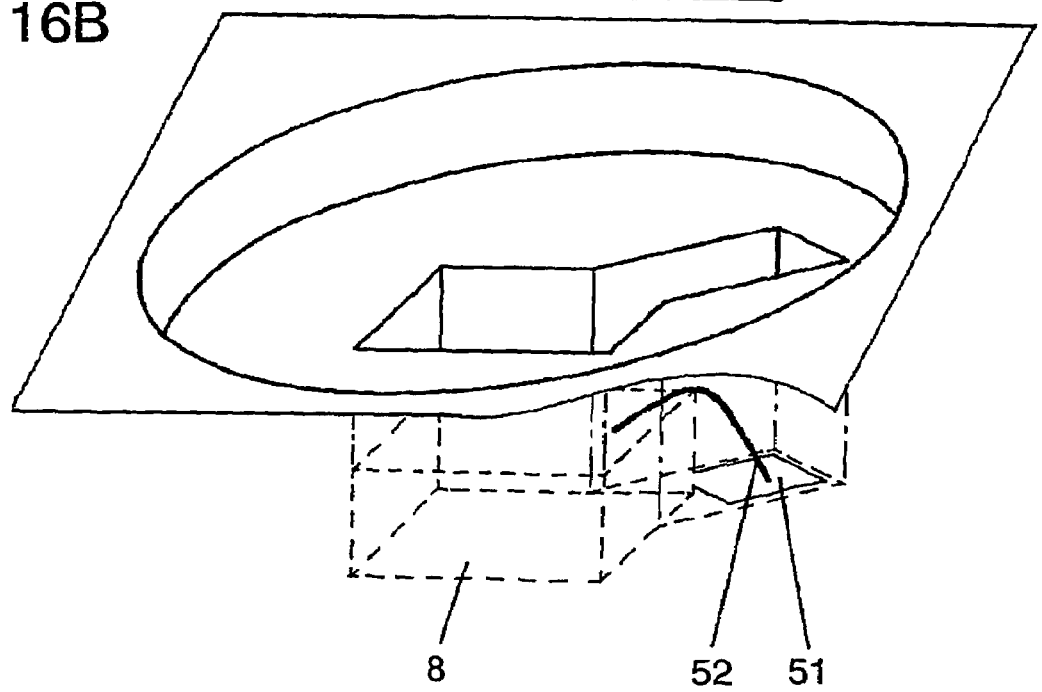
FIG. 16B is a perspective view of FIG. 16A.
Figure 17:
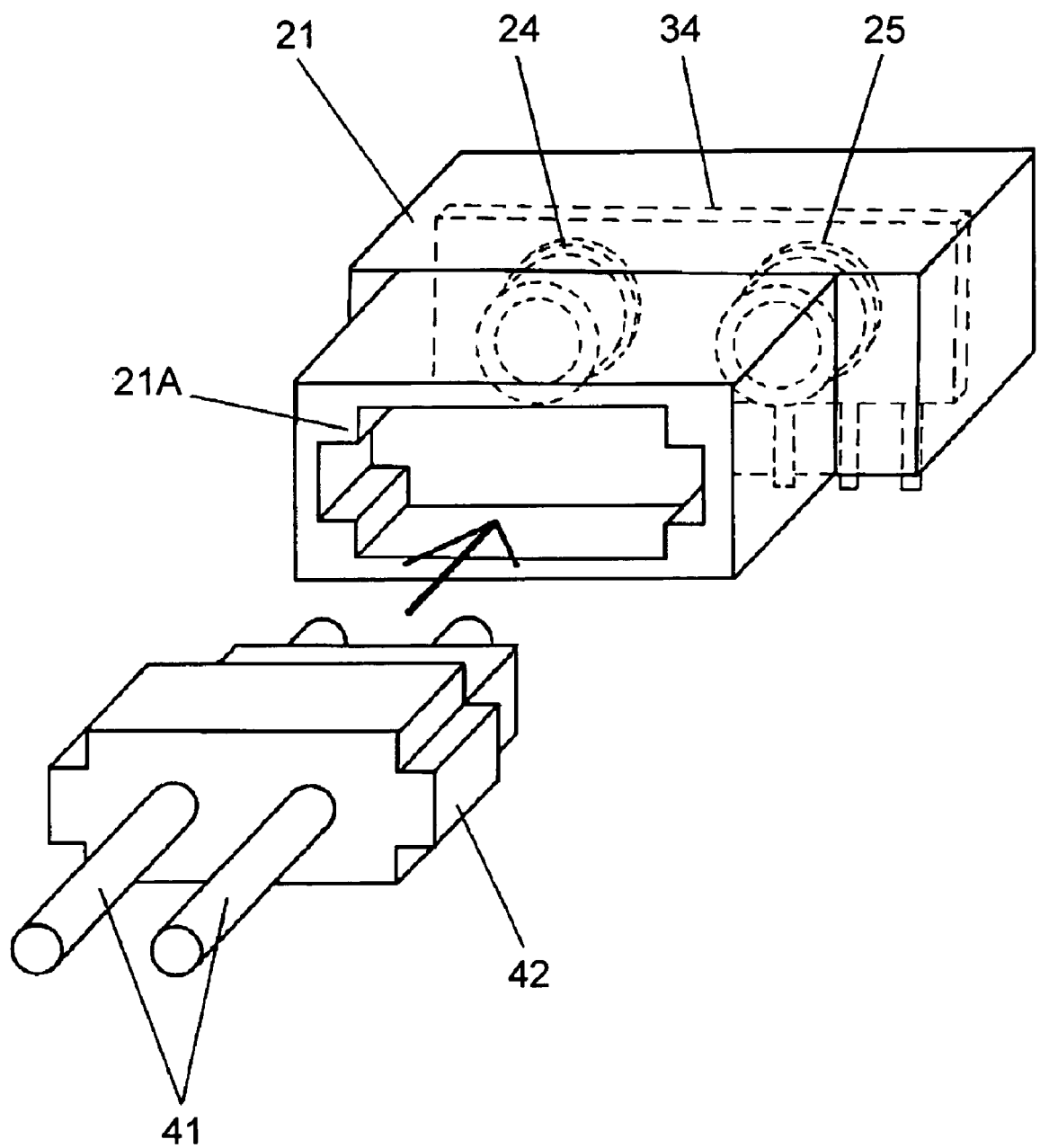
FIG. 17 is a perspective view of a package including a conventional transceiver module for optical communications.
Figure 18:
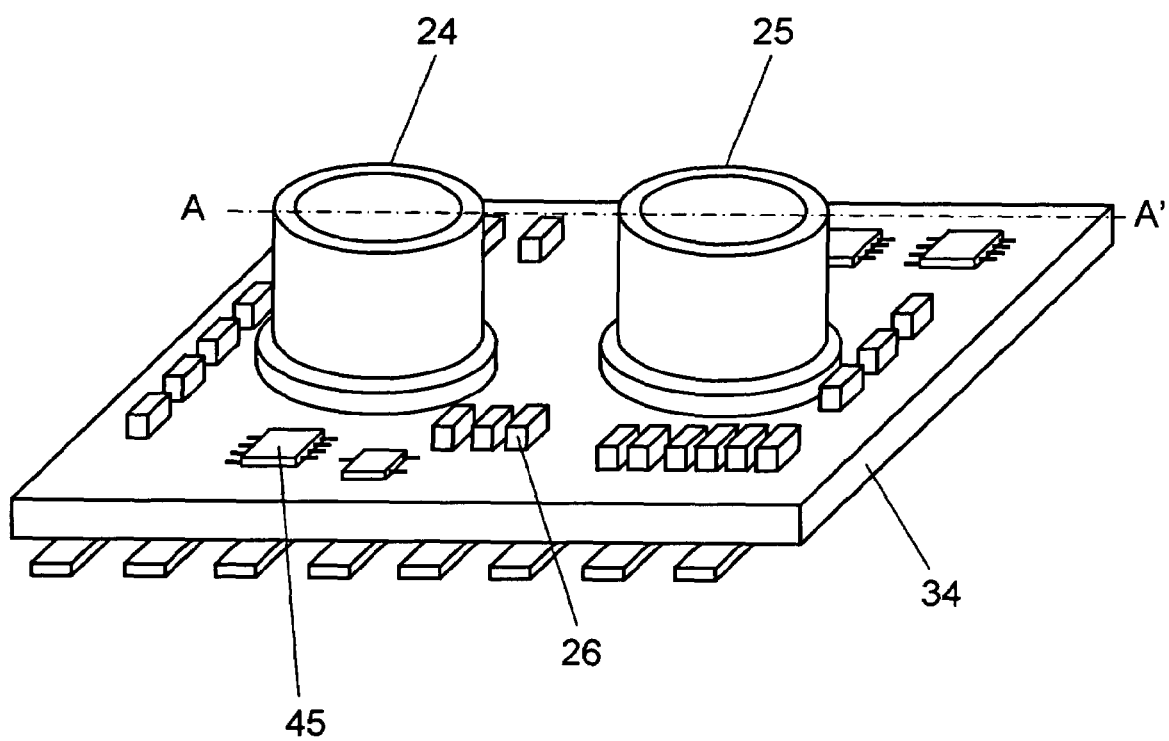
FIG. 18 is a perspective view of the conventional transceiver module for optical communications.
Figure 19:
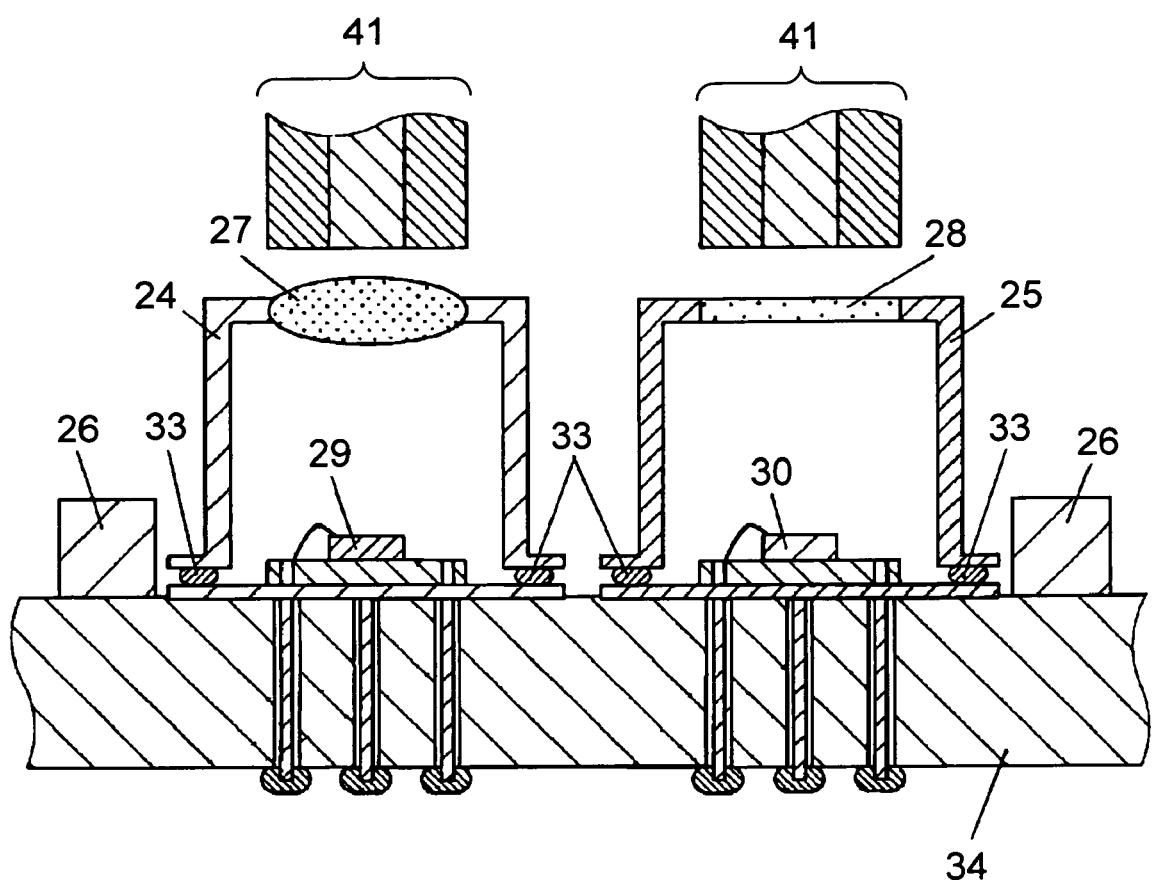
FIG. 19 is a sectional view of the conventional transceiver module for optical communications.

In the example shown in FIGS. 16A and 16B, electrode 51 formed in cavity 3 on substrate 6 and light-emitting device 8 fitted in cavity 3 are connected by wire 52 made such as of gold. In this structure, electrode 51 is formed on a groove where a backoff is created for the bonding tip at a wire bonding for electrical connection. This achieves an equivalent optical system by cavity 3 with only a single step. In both cases, the outlines of the top steps of cavities 3 and optical components 4 disposed on the top steps are made substantially the same. And the outline of these members and that of optical transmission lines 1 are made substantially the same to uniquely determine the position of optical transmission lines 1. This allows positioning of one of optical components 4 and optical transmission line 1 using only a single step.

In FIG. 3, the light output from light-emitting device 8 is focused through lens 4A, and enters optical transmission line 1 of the transmitting side. The light from the optical transmission line of the reception side passes through window 4B, and is applied to light-receiving device 9. By positioning light-emitting device 8, lens 4A, and optical transmission line 1; and light-receiving device 9, window 4B, and optical transmission line 1 by means of each of cavities 3, each of the optical axes of the optical systems at the transmission and reception sides can be easily aligned.

In this embodiment, the number of layers in substrate 6, which is a multilayer ceramic substrate, is preferably two or more than the number of steps of cavities 3. By creating through holes at predetermined positions in each ceramic layer before lamination, cavities 3 can be easily formed. The thickness of the ceramic layer which becomes the steps one level upper the floors of cavities 3 created on the surface of substrate 6 preferably has substantially the same thickness as light-emitting device 8 and light-receiving device 9. This facilitates the positioning of light-emitting device 8 and light-receiving device 9, and also facilitates wire bonding from the surface of light-emitting device 8 and light-receiving device 9. Furthermore, the mechanical strength of entire substrate 6 can be increased by fabricating the ceramic layer that becomes the floors of cavities 3 created on the surface of substrate 6 with firing powder or firing powder and machining.

Second Exemplary Embodiment

Figure 4:
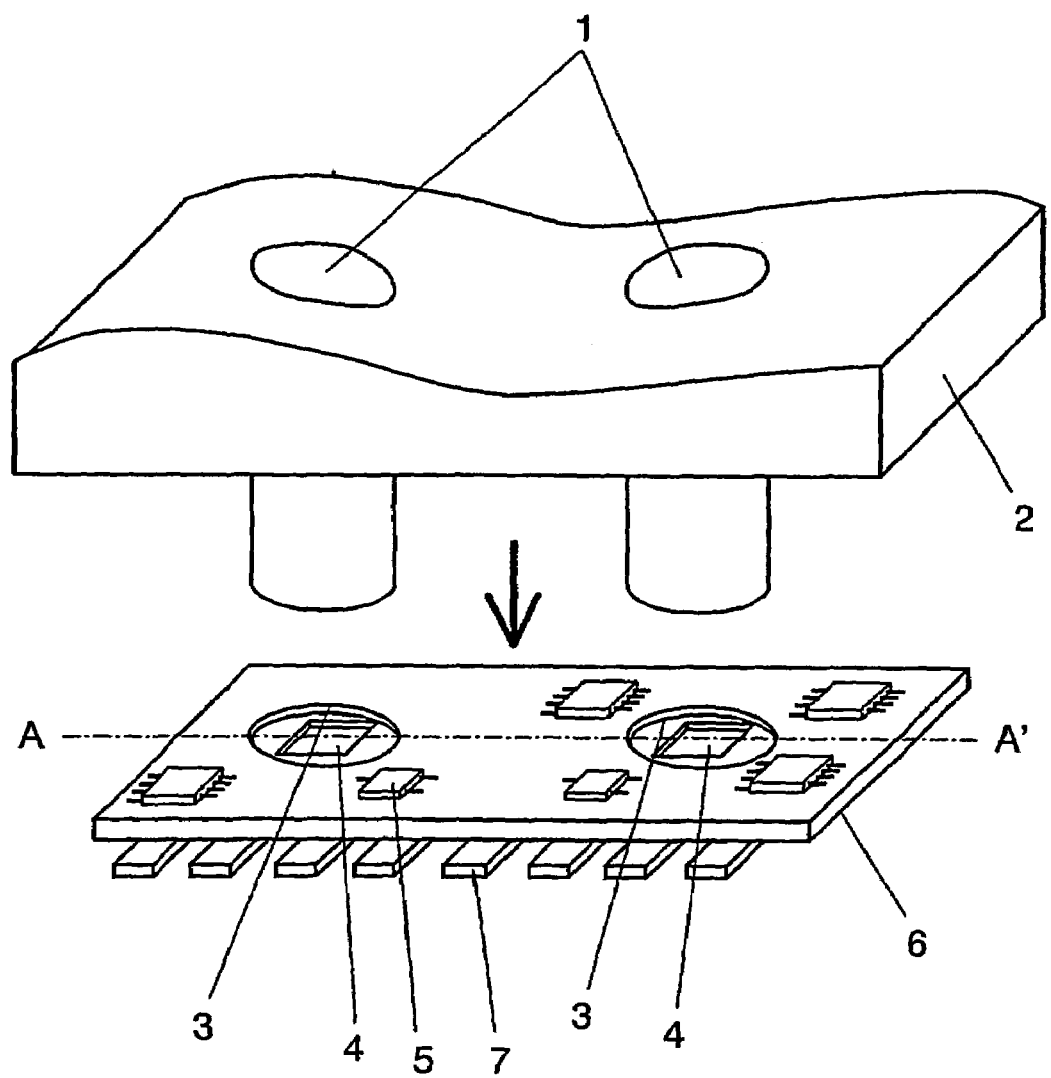
FIGS. 4 and 5 are perspective views of a transceiver module for optical communications in accordance with a second exemplary embodiment of the present invention.
Figure 5:
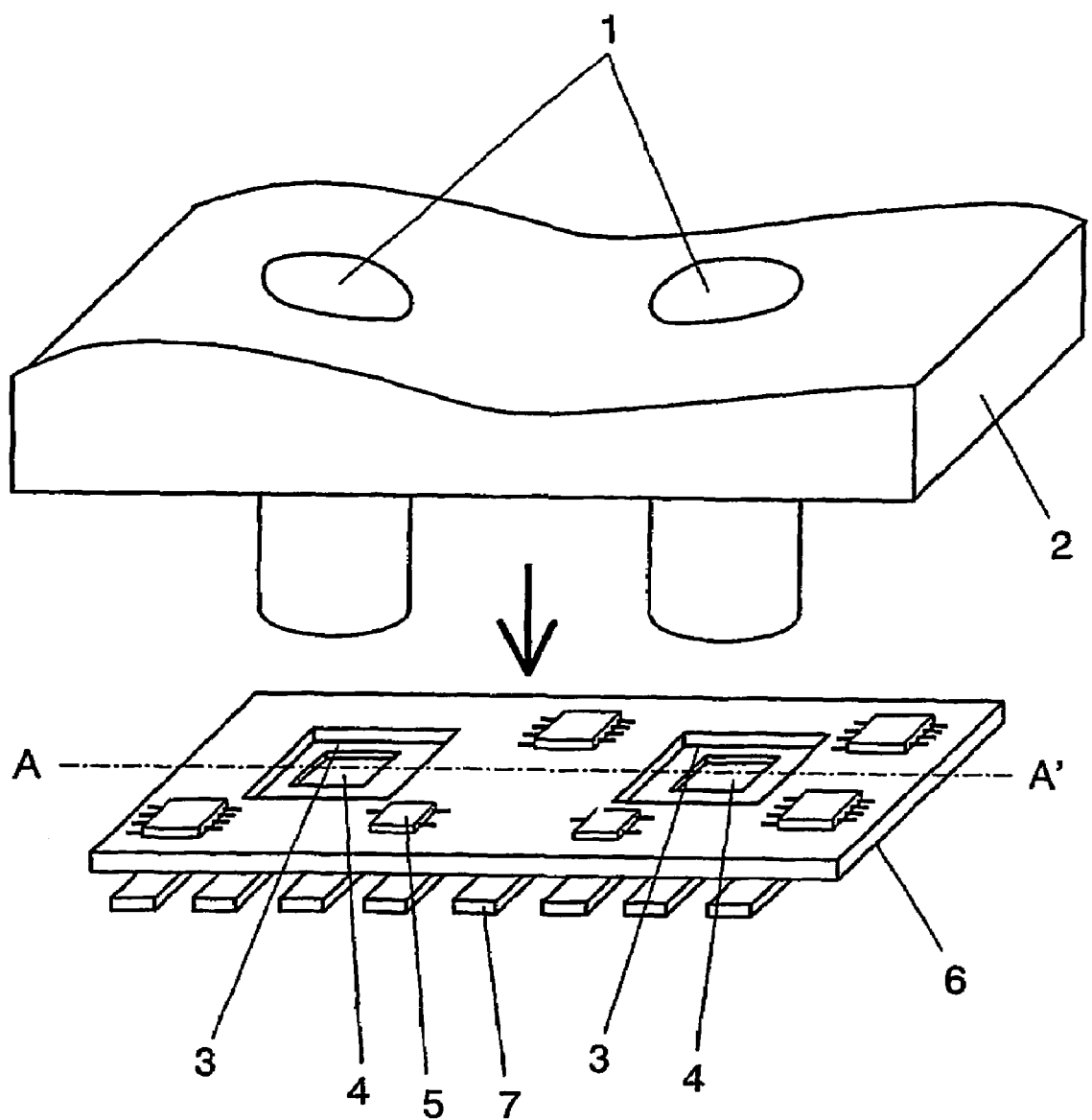
Figure 6:
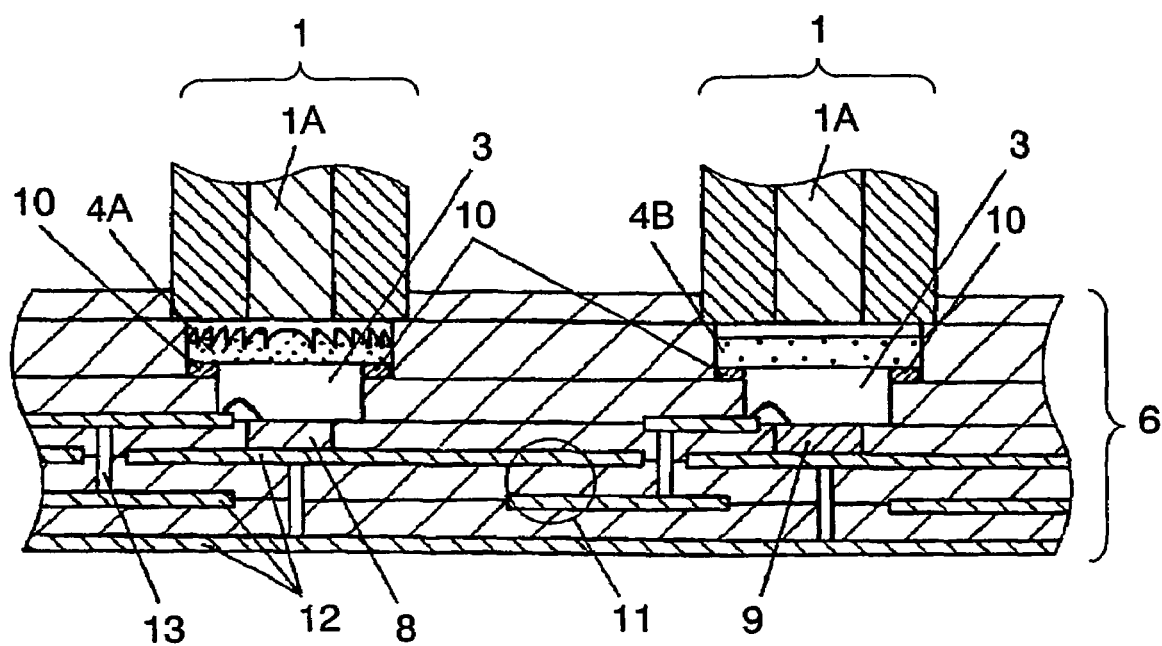
FIG. 6 is a sectional view of the transceiver module for optical communications in accordance with the second exemplary embodiment of the present invention.

FIGS. 4 and 5 are perspective views of a transceiver module for optical communications in a second exemplary embodiment of the present invention. FIG. 6 is a sectional view taken along Line A–A' in FIG. 4 or FIG. 5.

The transceiver module for optical communications shown in FIG. 4 has a different structure for cavities 3 compared to that in the first exemplary embodiment shown in FIG. 1. However, the other structures are identical. The top steps of cavities 3 have a shape substantially the same as that of optical transmission lines 1. Optical components 4 such as refractive lens, diffractive lens, optical iris, and window are installed on the steps one level below the top steps. As in the first exemplary embodiment, cavities 3 and optical components 4 can have other shapes such as square and triangle, as shown in FIG. 5, as long as the positions of optical transmission lines 1 are uniquely determined.

In FIG. 6, multi-step cavities 3 created on the surface of substrate 6, which is a multilayer ceramic substrate, have at least two steps, and light-emitting device 8 and light-receiving device 9 are mounted on their floors. Optical transmission lines 1 are abutted on the top steps. Optical components 4 (lens 4A and window 4B) are installed on the steps one level below the top steps, and then hermetically sealed by sealing material 10.

In the example shown in FIG. 6, the surface of light-emitting device 8 or that of light-receiving device 9 to the upper step is electrically connected by wire bonding, and therefore cavities 3 have three steps. On the other hand, as shown in FIGS. 16A and 16B, an equivalent optical system can be achieved with two-step cavity 3 by establishing electrical connection using wire bonding onto the floor. In both cases, when cavities 3 have two or more steps, optical transmission lines 1 can be positioned without allowing cores 1A of optical transmission lines 1 to contact and damage substrate 6 or optical components 4 by the use of two steps, i.e., a top step plus one step below, in cavities 3.

Cavities 3 can also have three or more steps. In this case, optical components 4 are installed on one of the steps, and optical transmission lines 1 are installed on any step above the steps holding optical components 4.

The depth of the steps where optical components 4 are installed is preferably greater than the thickness of optical components 4. Alternatively, it is preferable to provide a vacant step between the step where one of optical components 4 is installed and the step where optical transmission line 1 is installed, as described later with reference to FIG. 10. This prevents contact between optical components 4 and optical transmission lines 1.

The outline of the steps where optical components 4 are installed is preferably larger than cores 1A of optical transmission lines 1. This ensures that optical transmission lines 1 can be positioned so as to prevent cores 1A contacting and causing damage to optical components 4.

In the above transceiver module for optical communications, the light output from light-emitting device 8 is focused through diffractive lens 4A, and the focused light enters the optical transmission line 1 of the transmission side. The light from optical transmission line 1 of the reception side passes through window 4B and arrives at light-receiving device 9. As described above, the positioning of light-emitting device 8, lens 4A, and optical transmission line 1; and light-receiving device 9, window 4B, and optical transmission line 1 with respect to each of cavities 3 facilitates the alignment of each of the optical axes of the optical systems at the transmission and reception sides in the same way as that in the first exemplary embodiment. In addition, degradation of characteristics by wear is preventable because optical components 4 and optical transmission lines 1 do not come into contact.

Third Exemplary Embodiment

Figure 7:
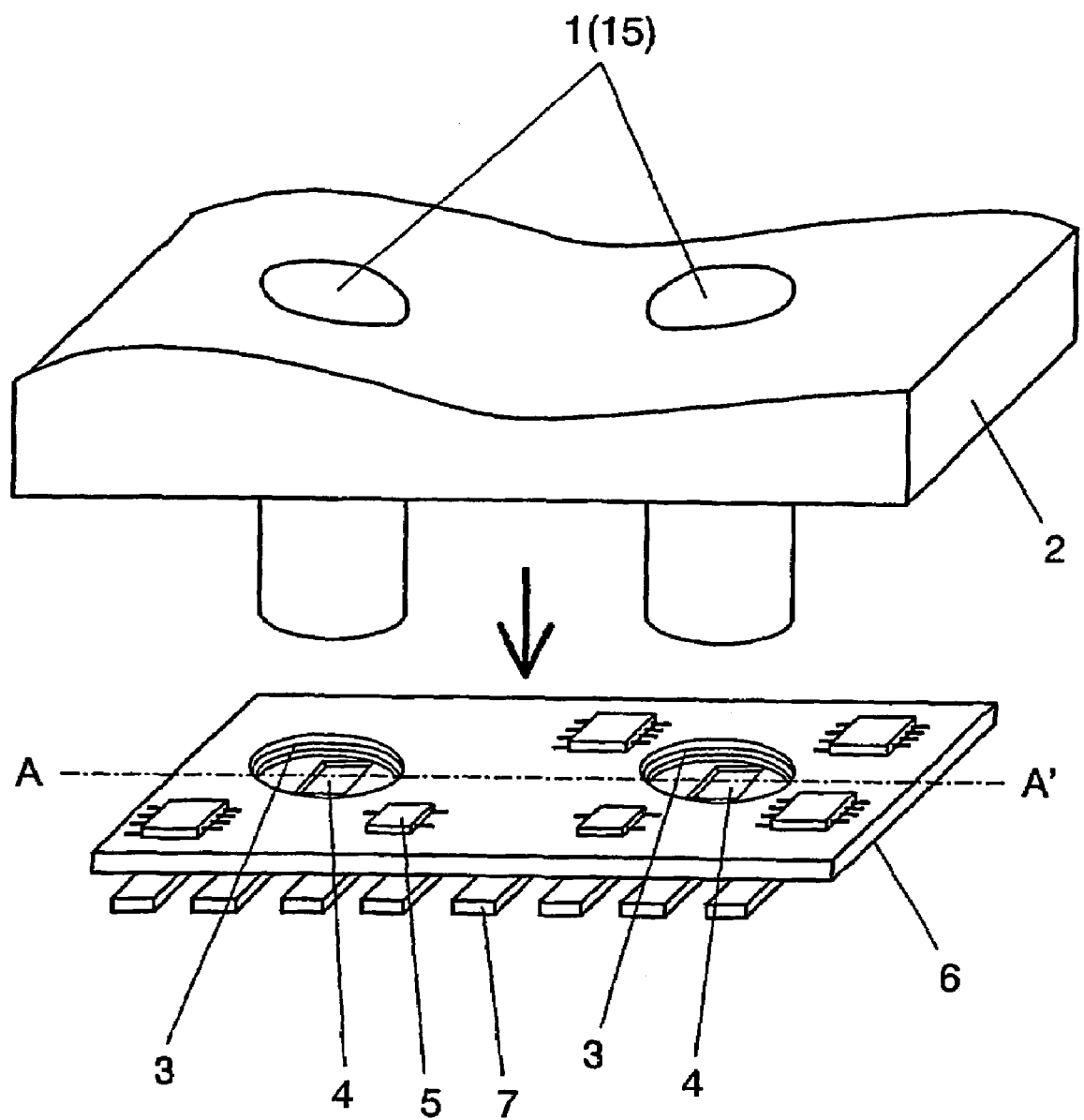
FIGS. 7 and 8 are perspective views of a light emission and receiving module for optical communications in accordance with a third exemplary embodiment of the present invention.
Figure 8:
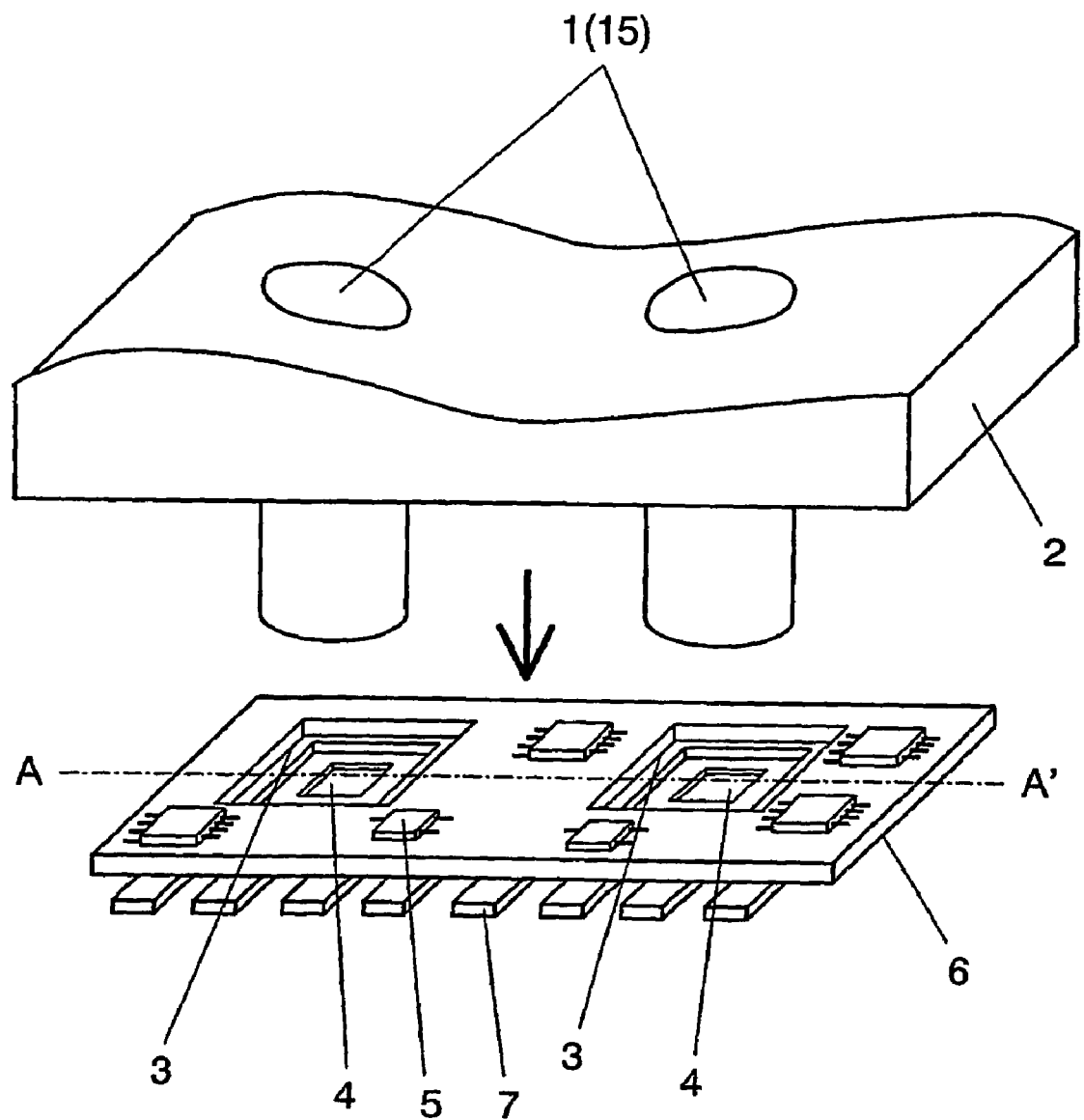
Figure 9:
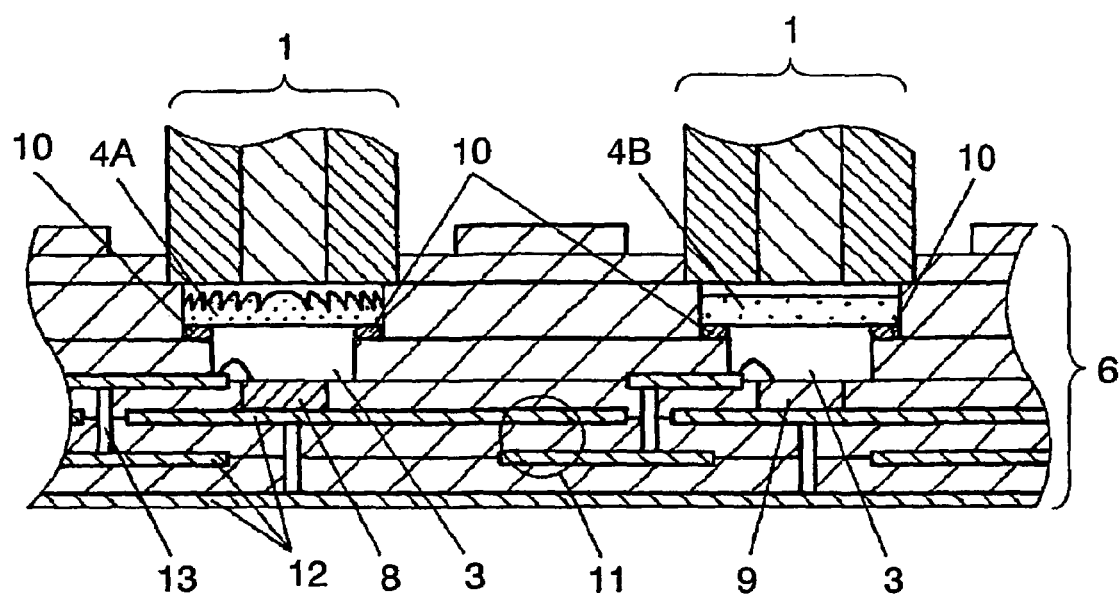
FIGS. 9 and 10 are sectional views of the transceiver module for optical communications in accordance with the third exemplary embodiment of the present invention.
Figure 10:
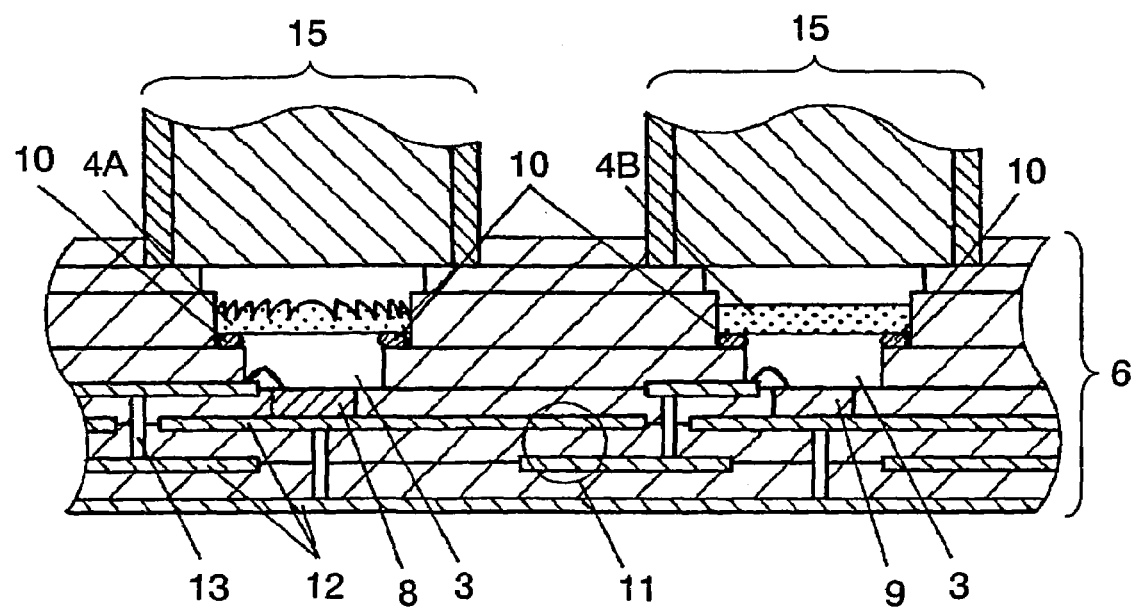

FIGS. 7 and 8 are perspective views of a transceiver module for optical communications in a third exemplary embodiment FIGS. 9 and 10 are sectional views taken along Line A–A' in FIG. 7 or FIG. 8.

The transceiver module for optical communications shown in FIG. 7 has a different structure for cavities 3 compared to that in the first exemplary embodiment shown in FIG. 1. However, the other structures are identical. As in the first exemplary embodiment, cavities 3 and optical components 4 can have other shapes such as square and triangle, as shown in FIG. 8, as long as the positions of optical transmission lines 1 are uniquely determined.

In the following description, the top step of cavity 3 is called a first cavity, and one level below the top step is called a second cavity, and then a third cavity which is another level below. The first cavity has a shape substantially the same as optical transmission line 15, and the second cavity has a shape substantially the same as optical transmission line 1 which has a smaller diameter than that of optical transmission line 15. Optical components 4 (lens 4A and window 4B) are installed on the third cavities.

In FIGS. 9 and 10, cavities 3 created on the surface of substrate 6 which is a multilayer ceramic substrate has at least three steps, and light-emitting device 8 and light-receiving device 9 are mounted on their floors. Moreover, optical transmission lines 15 are abutted on the first cavities as shown in FIG. 9, and optical transmission lines 1 are abutted on the second cavities as shown in FIG. 10. Optical components 4 are installed on the third cavities, and hermetically sealed by sealing material 10.

In the example shown in FIG. 9, the surface of light-emitting device 8 or the surface of light-receiving device 9 to the upper step is electrically connected by wire bonding, and therefore cavities 3 have four steps. On the other hand, as shown in FIGS. 16A and 16B, an equivalent optical system can be achieved with three-step cavity 3 by establishing electrical connection using wire bonding onto the floor.

In the example shown in FIG. 10, optical transmission line 15 is made of a plastic fiber, unlike that in FIG. 9. It is apparent from FIGS. 9 and 10 that the third exemplary embodiment is applicable to two types of optical transmission lines 1 and made of plastic-clad fiber and plastic fiber. The core diameters of the plastic fiber and plastic-clad fiber are sufficiently large to permit the light output from light-emitting device 8 to readily enter optical transmission lines 1 and 15 when these types of fibers are used as the optical transmission lines.

In FIG. 9, the light output from light-emitting device 8 is focused through lens 4A, and enters optical transmission line 1 of the transmission side. The light from optical transmission line 1 of the reception side passes through window 4B, and arrives at light-receiving device 9. As described above, the positioning of light-emitting device 8, lens 4A, and optical transmission line 1; and light-receiving device 9, window 4B, and optical transmission line 1 with respect to each of cavities 3 facilitates the alignment of each of the optical axes of the optical systems at the transmission and reception sides. In FIG. 10, the light output from light-emitting device 8 is focused through lens 4A, and enters optical transmission line 15 of the transmission side. The light from optical transmission line 15 of the reception side passes through window 4B, and arrives at light-receiving device 9. In the same way, the positioning of light-emitting device 8, lens 4A, and optical transmission line 15; and light-receiving device 9, window 4B, and optical transmission line 15 with respect to each of cavities 3 facilitates the alignment of each of the optical axes of the optical systems at the transmission and reception sides. In the same way as in the second exemplary embodiment, degradation of characteristics by wear is preventable because optical components 4 and optical transmission lines 1 and 15 do not come into contact. In addition, the third exemplary embodiment is applicable to two types of optical transmission lines 1 and 15, i.e., plastic-clad fiber and plastic fiber.

As described above, cavity 3 having three or more steps allows the positioning of two or more types of transmission lines 1 and 15 which have different outlines via the top step of cavity 3 and one level below the top step. Cavity 3 can also be configured with three or more steps, and optical transmission line 1 can be installed on a step other than the top step. As in the first exemplary embodiment, one of optical components 4 and optical transmission line 1 can also be installed on the same step, and optical transmission line 15 can be installed on one level above that step. This allows cavity 3 with only two steps to be used for optical transmission lines 1 and 15 with different outlines.

Fourth Exemplary Embodiment

Figure 11:
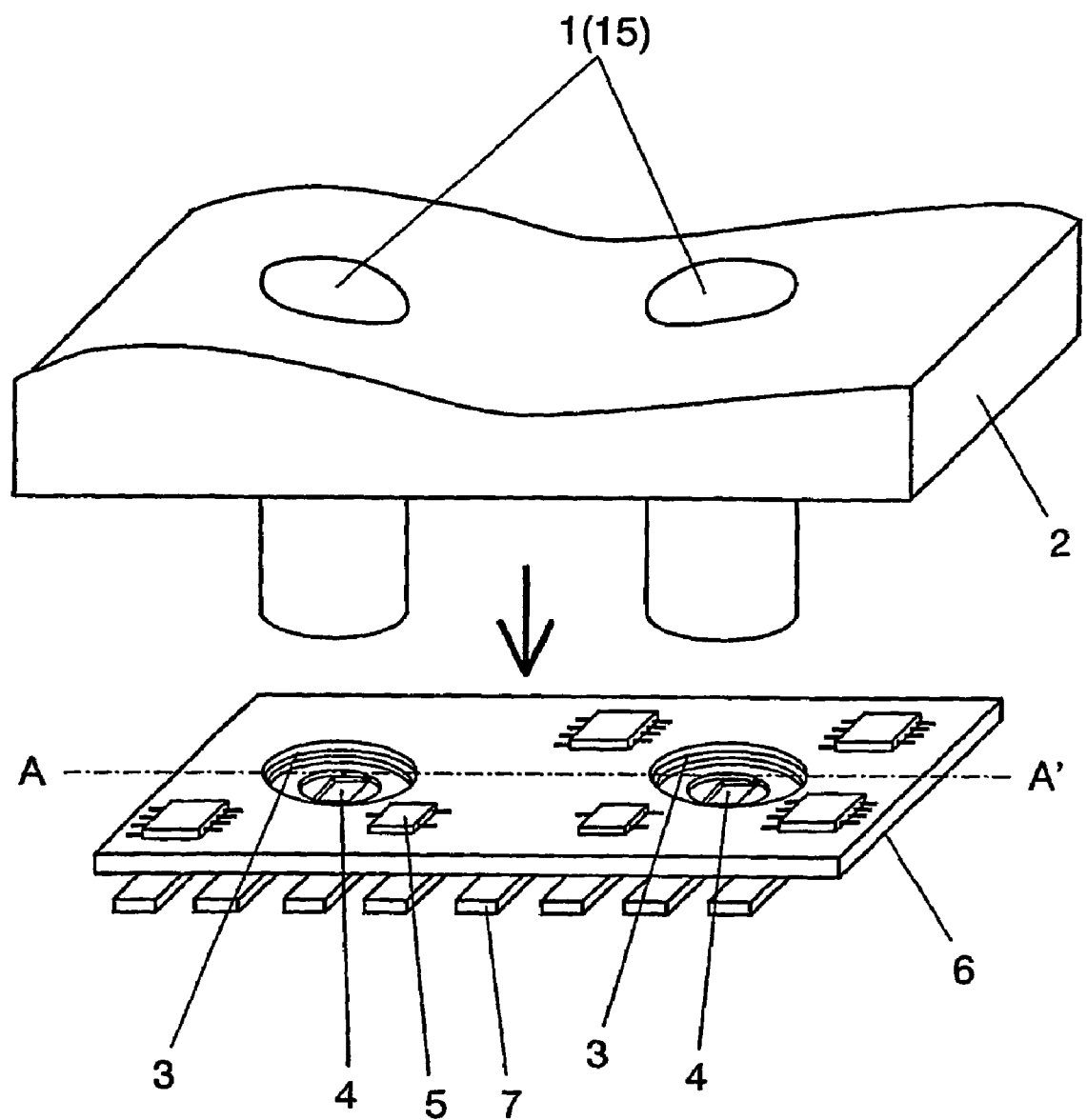
FIGS. 11 and 12 are perspective views of a transceiver module for optical communications in accordance with a fourth exemplary embodiment of the present invention.
Figure 12:
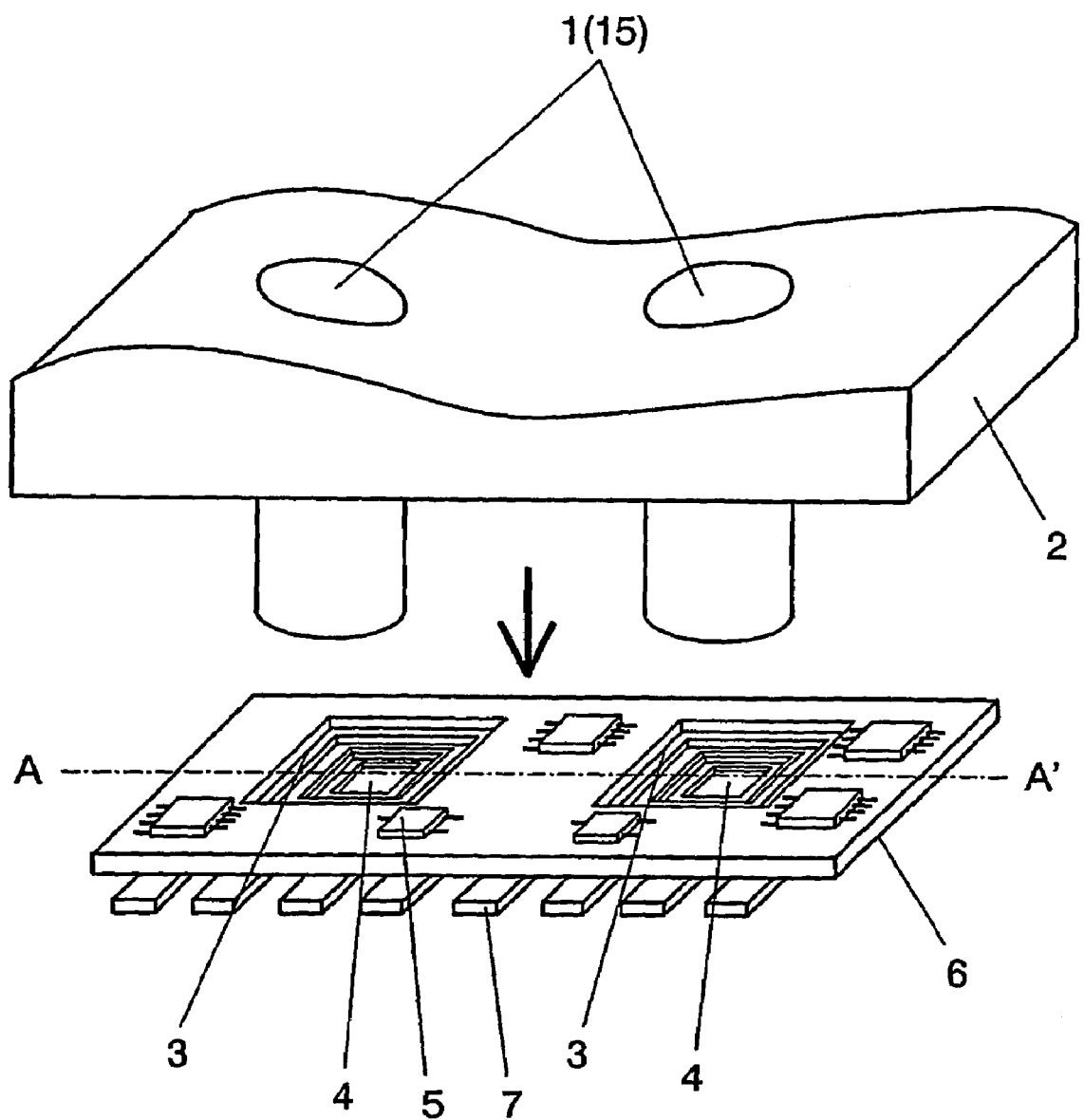
Figure 13:
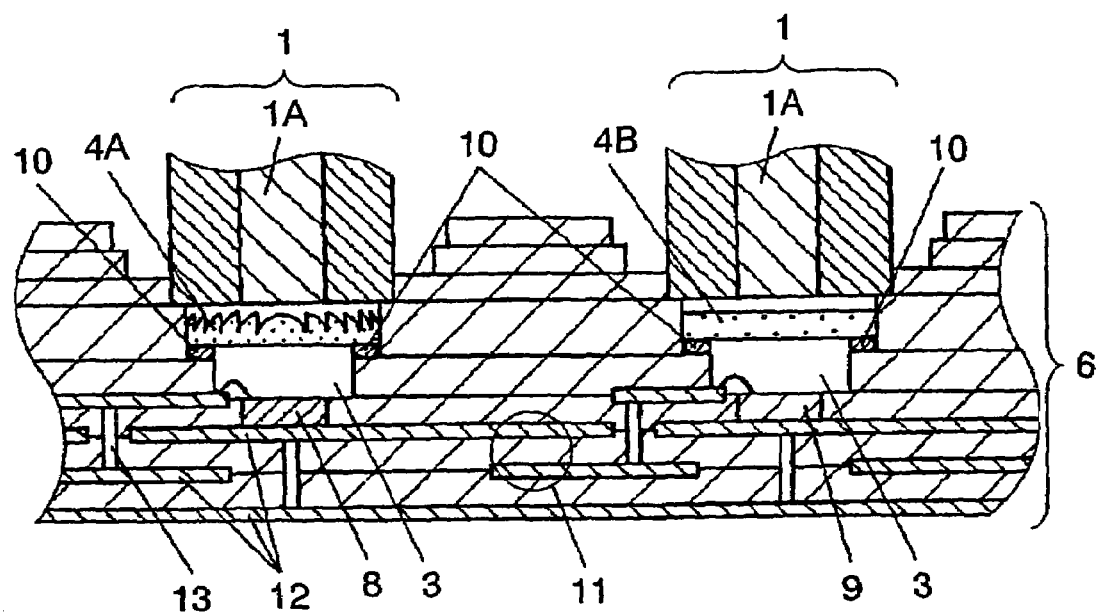
FIGS. 13 and 14 are sectional views of the transceiver module for optical communications in the fourth exemplary embodiment of the present invention.
Figure 14:
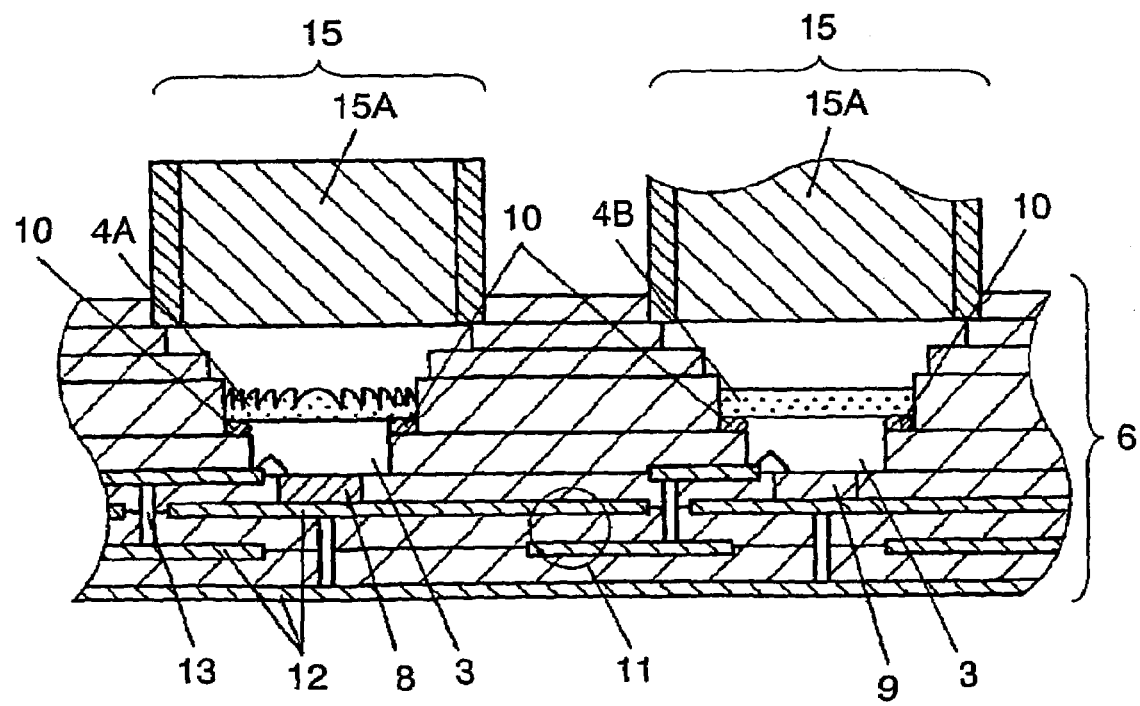

FIGS. 11 and 12 are perspective views of a transceiver module for optical communications in a fourth exemplary embodiment of the present invention. FIGS. 13 and 14 are sectional views taken along Line A–A' in FIG. 11 or FIG. 12.

The module shown in FIG. 11 has a different structure for cavities 3 compared to that in the first exemplary embodiment shown in FIG. 1, but the other structures are identical. Also as in the first exemplary embodiment, cavities 3 and optical components 4 can have other shapes such as square and triangle, as shown in FIG. 12, as long as the positions of optical transmission lines 1 are uniquely determined.

In the following description, the top step of cavity 3 is called a first cavity, and one level below the top step is called a second cavity, and then a third cavity and fourth step downward. The first cavity has a shape substantially the same as optical transmission line 15, and the second cavity is larger than core 15A of optical transmission line 15. The third cavity has a shape substantially the same as optical transmission line 1 that has a smaller diameter than that of optical transmission line 15. The fourth cavity is larger than core 1A of optical transmission line 1. Optical components 4 (lens 4A and window 4B) are installed on the fourth cavities.

In FIGS. 13 and 14, multi-step cavities 3 created on the surface of substrate 6 have at least four steps, and light-emitting device 8 and light-receiving device 9 are mounted on their floors. In FIG. 13, optical transmission lines 1 are abutted on the third cavities. In FIG. 14, optical transmission lines 15 are abutted on the first cavities. Optical components 4 are installed on the fourth cavity, and then hermetically sealed by sealing material 10.

In the example shown in FIG. 13, the surface of light-emitting device 8 or that of light-receiving device 9 to the upper step is electrically connected by wire bonding, and therefor cavities 3 have five steps. On the other hand, as shown in FIGS. 16A and 16B, an equivalent optical system can be achieved with four-step cavities 3 by establishing electrical connection using wire bonding onto the floors.

In the example shown in FIG. 14, plastic fibers are used for optical transmission lines 15, unlike the example shown in FIG. 13. Accordingly, it is apparent from FIGS. 13 and 14 that this embodiment is applicable to two types of optical transmission lines 1 and 15, i.e., plastic-clad fiber and plastic fiber.

As described above, cavity 3 having four or more steps enables positioning of optical transmission line 1 having a smaller diameter than that of optical transmission line 15 by using two steps which are two levels and three levels below the top step of cavity 3. This prevents the cores of optical transmission lines 1 contacting and being damaging substrate 6 and optical components 4.

Fifth Exemplary Embodiment

Figure 15:
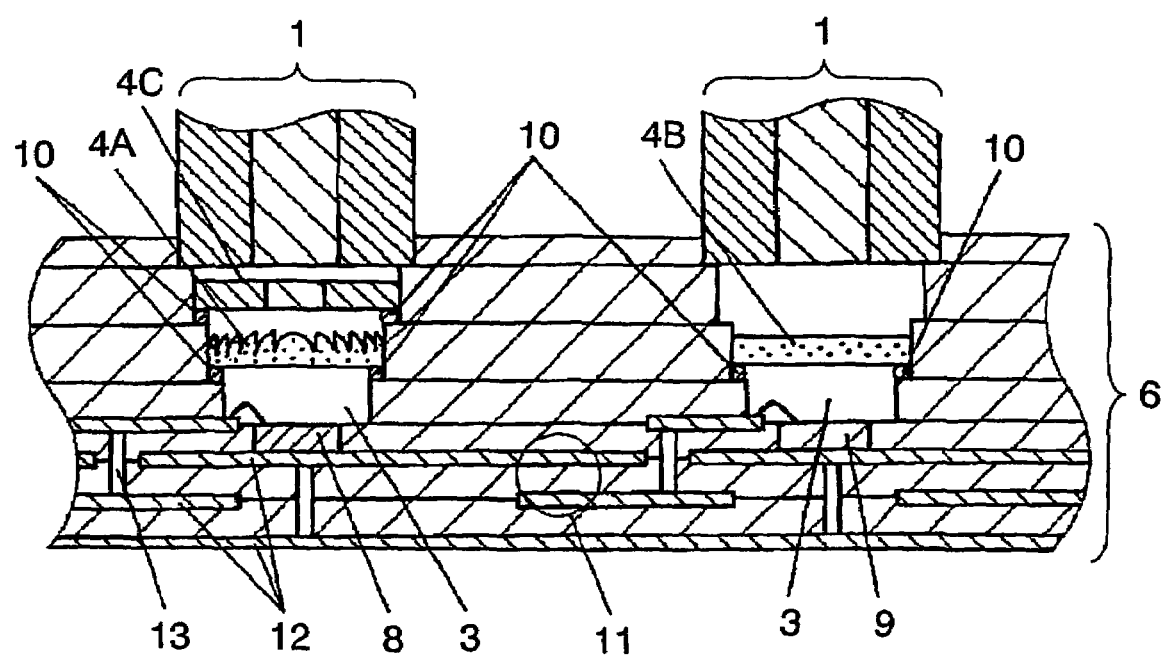
FIG. 15 is a sectional view of a transceiver module for optical communications in accordance with a fifth exemplary embodiment of the present invention.

FIG. 15 is a sectional view of a transceiver module in a fifth exemplary embodiment taken along Line A–A'. A perspective view of the transceiver module for optical communications in this embodiment is the same as that shown in FIG. 7 or FIG. 8.

Cavities 3 created on the surface of substrate 6 have at least three steps. And the top steps is called the first cavity, and then the second cavity, and third cavity downward. Optical transmission lines 1 are abutted on the first cavities. Optical components such as optical iris 4C and diffractive lens 4A are installed on the second and third cavities respectively, and are hermetically sealed using sealing material 10. Light-emitting device 8 and light-receiving device 9 are mounted on the floors of cavities 3. The other structures are the same as those in the third exemplary embodiment.

In FIG. 15, the surface of light-emitting device 8 or that of light-receiving device 9 to the upper step is electrically connected by wire bonding, and therefore cavities 3 have four steps. On the other hand, in the example shown in FIGS. 16A and 16B, an equivalent optical system can be achieved with three-step cavities 3 by establishing electrical connection using wire bonding onto the floors. In addition, in FIG. 15, optical transmission lines 1 is positioned in the first cavities, and optical components 4 (optical iris 4C and window 4B) are positioned in the second or third cavities to prevent contact between optical transmission lines 1 and optical components 4. However, the number of steps in cavities 3 can be reduced by one if both optical transmission lines 1 and optical components 4 are positioned in the first cavities.

The light output from light-emitting device 8 is focused through lens 4A, and optical iris 4C removes excess light. Then, the light enters optical transmission line 1 of the transmission side. The light from optical transmission line 1 of the reception side passes through window 4B, and arrives at light-receiving device 9. As described above, the positioning of light-emitting device 8, lens 4A, optical iris 4C, and optical transmission line 1; and light-receiving device 9, window 4B, and optical transmission line 1 with respect to each of cavities 3 facilitates the alignment of each of the optical axes of the optical systems at the transmission and reception sides regardless of the number of optical components 4. When optical transmission line 1 is installed on the top step of cavity 3 or optical transmission line 1 and one of optical components 4 are installed on the top step, the positioning of at least two optical components 4 with different outlines can be achieved by using remaining steps.

All exemplary embodiments mentioned above refer to a single module for both transmission and reception. It is apparent that the alignment of optical axis described in the present invention is also effective for modules for transmission or reception only.

INDUSTRIAL APPLICABILITY

The present invention allows integrated alignment of optical axis of the optical transmission line, optical components, and light-emitting device or light-receiving device, and thus a smaller and shorter transceiver module for optical communications is achievable.

REFERENCE NUMERALS IN THE DRAWINGS 1, 15 Optical transmission line
1A Core
2 Fixing jug
3 Cavity
4 Optical component
4A Diffractive lens
4B Window
4C Optical iris
5 Semiconductor device
6 Substrate
7 Terminal
8 Light-emitting device
9 Light-receiving device
10 Airtight sealing material
11 Passive element
12 Electric line
13 Via hole
21 Package
21A Adapter
24 CAN package for transmission
25 CAN package for reception
26 Passive element
27 Lens
28 Window
29 Light-emitting device
30 Light-receiving device
33 Airtight sealing material
34 Printer circuit board
41 Optical transmission line
42 Fixing jig
45 Semiconductor device
51 Electrode
52 Wire

The invention claimed is:

1. An optical communications module comprising:
at least one of a light-emitting device and a light-receiving device;
at least one of a first optical transmission line transmitting light from said light-emitting device and a second transmission line transmitting light to said light-receiving device;
an optical component optically coupling at least one of said light-emitting device and said first optical transmission line, and said light-receiving device and said second optical transmission line; and
a substrate on whose surface a cavity is formed, said cavity having a floor and at least one step, and at least one of a group of said light-emitting device, said optical component and said first optical transmission line, and a group of said light-receiving device, said optical component and said second optical transmission line being mounted on said cavity, an edge of said substrate which defines said cavity completely surrounds a circumference of at least one of said first and said second optical transmission line.
wherein an optical axis of one of said light-emitting device and said light-receiving device and an optical axis of said optical component are matched by abutting at least one of said first optical transmission line and said second optical transmission line on said cavity.

2. The optical communications module as defined in claim 1, wherein at least one of said first optical transmission line and said second optical transmission line is made of one of a plastic fiber and a plastic-clad fiber.

3. The optical communications module as defined in claim 1, wherein said light-emitting device includes one of a light-emitting diode and a laser diode, and said light-receiving device includes a photo diode.

4. The optical communications module as defined in claim 1, wherein said optical component includes a refractive lens.

5. The optical communications module as defined in claim 1, wherein said optical component includes a diffractive lens.

6. The optical communications module as defined in claim 1, wherein said optical component includes an optical iris.

7. The optical communications module as defined in claim 1, wherein said optical component hermetically seals at least one of said light-emitting device and said light-receiving device.

8. The optical communications module as defined in claim 1, wherein said optical component is hermetically sealed onto said cavity by one of glass, resin, and solder.

9. The optical communications module as defined in claim 1, wherein at least one of said light-emitting device and said light-receiving device is disposed on said floor of said cavity, and said optical component and at least one of said first optical transmission line and said second optical transmission line are disposed on said step of said cavity.

10. The optical communications module as defined in claim 1, wherein said cavity has one of one and a plurality of said steps, and at least one of a group of said optical component and said first optical transmission line, and a group of said optical component and said second optical transmission line is disposed on a first step, said first step being one of one and the plurality of said steps.

11. The optical communications module as defined in claim 1, wherein an outline of said step where one of said first optical transmission line and said second optical transmission line is disposed and an outline of said optical component are same as an outline of one of said first optical transmission line and said second optical transmission line disposed on said step.

12. The optical communications module as defined in claim 1, wherein said step of said cavity include a first step and a second step which is below said first step, at least one of said first optical transmission line and said second optical transmission line is disposed on said first step, and said optical component is disposed on said second step.

13. The optical communications module as defined in claim 1, wherein at least one of said first optical transmission line and said second optical transmission line is disposed separately from said optical component.

14. The optical communications module as defined in claim 12, wherein said cavity has intermediate step between said first step and said second step.

15. The optical communications module as defined in claim 12, wherein a height of said second step is greater than a thickness of said optical component.

16. The optical communications module as defined in claim 12, wherein an outline of said second step is larger than a core of one of said first optical transmission line and said second optical transmission line disposed on said first step.

17. The optical communications module as defined in claim 1, wherein said cavity has at least three steps, and said optical component is provided in a plurality, said optical components having different outlines are disposed on said cavity on a same optical axis.

18. The optical communications module as defined in claim 1, wherein said substrate is a multilayer ceramic substrate having the number of layers two more than the number of step(s) of said cavity.

19. The optical communications module as defined in claim 18, wherein a ceramic layer which becomes said floor of said cavity is made through a process including at least firing of powder.

20. The optical communications module as defined in claim 1, wherein a height of the step one level upper the floor of said cavity is equivalent to a thickness of at least one of said light-emitting device and said light-receiving device.

21. The optical communications module as defined in claim 1, wherein a semiconductor device for controlling at least one of said light-emitting device and said light-receiving device is mounted on said substrate.

22. A substrate for optical communications module, said optical communications module comprising:
at least one of a light-emitting device and a light-receiving device;
at least one of a first optical transmission line for transmitting light from said light-emitting device and a second optical transmission line for transmitting light to said light-receiving device; and
an optical component for optically coupling at least one of said light-emitting device and said first optical transmission line, and said light-receiving device and said second optical transmission line;
wherein a cavity having a floor and at least one step is formed on a surface of said substrate, and at least one of a group of said light-emitting device, said optical component and said first optical transmission line, and a group of said light-receiving device, said optical component, and said second optical transmission line is mounted on said cavity, an edge of said substrate which defines said cavity completely surrounds a circumference of at least one of said first and said second optical transmission line,
wherein an optical axis of one of said light-emitting device and said light-receiving device and an optical axis of said optical component are matched by abutting at least one of said first optical transmission line and said second optical transmission line on said cavity.

23. The substrate as defined in claim 22, wherein an outline of said step on which one of said first optical transmission line and said second optical transmission line is disposed, and an outline of said optical component are same as an outline of one of said first optical transmission line and said second optical transmission line disposed on said step.

24. The substrate as defined in claim 22, wherein said step of said cavity includes a first step and a second step which is below said first step, at least one of said first optical transmission line and said second optical transmission line is disposed on said first step, and said optical component is disposed on said second step.

25. The substrate as defined in claim 24, wherein a height of said second step is greater than a thickness of said optical component.

26. The substrate as defined in claim 24, wherein an outline of said second step is larger than a core of one of said first optical transmission line and said second optical transmission line disposed on said first step.

27. The substrate as defined in claim 24, wherein said cavity has an intermediate step between said first step and said second step.

28. The substrate as defined in claim 27, wherein an outline of said intermediate step is same as an outline of a third optical transmission line, said third optical transmission line having a outer diameter smaller than that of at least one of said first optical transmission line and said second optical transmission line.

29. The substrate as defined in claim 28, wherein an outline of said second step is larger than a core of said third optical transmission line.

30. The substrate as defined in claim 24, wherein said cavity has intermediate step between said first step and said second step, said intermediate step has an outline same as an outline of a third optical transmission line, said third optical transmission line having a outer diameter smaller than that of at least one of said first optical transmission line and said second optical transmission line.

* * * * *

UNITED STATES PATENT AND TRADEMARK OFFICE
CERTIFICATE OF CORRECTION

| | | |
|---|---|---|
| PATENT NO. | : 7,232,263 B2 | Page 1 of 1 |
| APPLICATION NO. | : 10/500529 | |
| DATED | : June 19, 2007 | |
| INVENTOR(S) | : Nobuo Sashinaka et al. | |

It is certified that error appears in the above-identified patent and that said Letters Patent is hereby corrected as shown below:

On title page
Page 2, Item (56) References Cited, FOREIGN PATENT DOCUMENTS
change "WO      WO 99/44087      9/1999"
to -- WO      99/44087      9/1999 --

Page 2, Item (56) References Cited, FOREIGN PATENT DOCUMENTS
change "WO      WO 2003/019617      3/2003"
to -- WO      2003/019617      3/2003 --

Column 10 claim 12
Line 40, change "include" to -- includes --

Column 12 claim 30
Line 33, after "has" add -- an --

Signed and Sealed this

Twentieth Day of November, 2007

JON W. DUDAS
*Director of the United States Patent and Trademark Office*